(12) United States Patent
Hanaoka

(10) Patent No.: US 7,670,859 B2
(45) Date of Patent: Mar. 2, 2010

(54) SEMICONDUCTOR DEVICE AND METHOD FOR MANUFACTURING THE SAME

(75) Inventor: Terunao Hanaoka, Suwa (JP)

(73) Assignee: Seiko Epson Corporation (JP)

( * ) Notice: Subject to any disclaimer, the term of this patent is extended or adjusted under 35 U.S.C. 154(b) by 559 days.

(21) Appl. No.: 11/551,487

(22) Filed: Oct. 20, 2006

(65) Prior Publication Data

US 2007/0090854 A1 Apr. 26, 2007

(30) Foreign Application Priority Data

Oct. 21, 2005 (JP) .............................. 2005-306952

(51) Int. Cl.
*H01L 21/66* (2006.01)
*G01R 31/26* (2006.01)

(52) U.S. Cl. .......... 438/17; 257/E21.521; 257/E21.522; 257/E21.523; 324/765; 324/754

(58) Field of Classification Search .................. 438/17; 257/E21.521, E21.522, E21.523, E21.525; 324/765, 754

See application file for complete search history.

(56) References Cited

U.S. PATENT DOCUMENTS

| | | | | |
|---|---|---|---|---|
| 5,357,400 A | * | 10/1994 | Takekawa .................... | 361/704 |
| 5,679,978 A | * | 10/1997 | Kawahara et al. ........... | 257/697 |
| 5,804,467 A | * | 9/1998 | Kawahara et al. ........... | 438/112 |
| 5,969,426 A | * | 10/1999 | Baba et al. .................... | 257/778 |
| 6,020,747 A | * | 2/2000 | Bahns et al. ................. | 324/754 |
| 6,707,153 B2 | | 3/2004 | Kuwabara et al. | |
| 6,831,294 B1 | | 12/2004 | Nishimura et al. | |
| 6,982,565 B2 | * | 1/2006 | Kirby .......................... | 324/755 |
| 7,129,422 B2 | * | 10/2006 | Arnold ........................ | 174/377 |
| 7,233,076 B2 | * | 6/2007 | Matsuki et al. ............. | 257/795 |
| 7,247,879 B2 | | 7/2007 | Nishimura et al. | |
| 2002/0180026 A1 | * | 12/2002 | Liu et al. .................... | 257/692 |
| 2004/0209406 A1 | * | 10/2004 | Jan et al. .................... | 438/148 |
| 2007/0241330 A1 | | 10/2007 | Nishimura et al. | |
| 2009/0223043 A1 | * | 9/2009 | Hsu et al. .................... | 29/830 |

FOREIGN PATENT DOCUMENTS

| | | |
|---|---|---|
| JP | 10-209235 | 8/1998 |
| JP | 11-297873 | 10/1999 |
| JP | 2004-047771 | 2/2004 |
| JP | 2004-158827 | 6/2004 |
| JP | 2004-281896 | 10/2004 |
| JP | 2004-304152 | 10/2004 |
| WO | WO00-44041 | 7/2000 |
| WO | 01/71805 | 9/2001 |

* cited by examiner

*Primary Examiner*—M. Wilczewski
(74) *Attorney, Agent, or Firm*—Harness, Dickey & Pierce, P.L.C.

(57) ABSTRACT

A method for manufacturing a semiconductor device, includes: preparing a semiconductor module including: a semiconductor substrate having an electrode; a test pad electrically connected to the electrode; a land electrically connected to the test pad; and an external terminal provided on the land; and testing an electrical characteristic by bringing a probe into contact with the test pad.

6 Claims, 3 Drawing Sheets

SEMICONDUCTOR DEVICE AND METHOD FOR MANUFACTURING THE SAME

The entire disclosure of Japanese Patent Application No. 2005-306952, filed Oct. 21, 2005 is expressly incorporated by reference herein.

BACKGROUND OF THE INVENTION

1. Technical Field

The present invention relates to a semiconductor device and a method for manufacturing the same.

2. Related Art

With development of miniaturization of semiconductor devices, it is important to ensure reliability of the semiconductor devices at the same time. In order to ensure the reliability of the semiconductor devices, it is also important to carry out electrical characteristics test to the semiconductor devices. At present, a probe test is generally known as a method for the electrical characteristics test of the semiconductor devices. This test method is to test electrical characteristics by bringing a test pin referred to as a probe into contact with a test object. In order to carry out a highly reliable probe test, an area of the test object bringing the probe into contact with is preferably large.

International Publication Pamphlet No. 01/71805 is an example of related art.

SUMMARY

An advantage of the present invention is to provide a semiconductor device and a method for manufacturing the same that enables miniaturization and high reliability.

(1) A method for manufacturing a semiconductor device according to the present invention includes: preparing a semiconductor module including: a semiconductor substrate having an electrode; a test pad electrically connected to the electrode; a land electrically connected to the test pad; and an external terminal provided on the land; and testing electrical characteristics by bringing a probe into contact with the test pad. The present invention can easily carry out electrical characteristics test, even if a size of the electrode is made small. Further, the present invention can easily carry out the electrical characteristics test to the semiconductor module formed with the external terminal. More specifically, the present invention can provide the method for manufacturing the semiconductor device which can manufacture the semiconductor device enabling miniaturization and high reliability. Furthermore, the method for manufacturing the semiconductor device may use the semiconductor module including the semiconductor substrate having a plurality of electrodes; a plurality of test pads electrically connected to the plurality of electrodes; a land electrically connected to either one of the test pads; and an external terminal provided on the land.

(2) In the method for manufacturing the semiconductor device, the test pad may be larger than the electrode in size.

(3) In the method for manufacturing the semiconductor device, the semiconductor module may also have a resin layer formed with an opening which exposes the test pad.

(4) In the method for manufacturing the semiconductor device, forming a coating portion which covers an exposed portion from the opening of the resin layer on the test pad may be carried out after the electrical characteristics test.

(5) In the method for manufacturing the semiconductor device, forming a reinforcement layer which reinforces a base of the external terminal may be included.

(6) In the method for manufacturing the semiconductor device, the coating portion may be formed by the reinforcement layer.

(7) In the method for manufacturing the semiconductor device, the electrode and the test pad are being electrically connected by a wiring, and the test pad may be wider than the wiring in width.

(8) In the method for manufacturing the semiconductor device, the land and the test pad are being electrically connected by the wiring, and the test pad may be wider than the wiring in width.

(9) A semiconductor device according to the present invention includes, a semiconductor substrate having an electrode; a test pad electrically connected to the electrode; a land electrically connected to the test pad; and an external terminal provided on the land. The present invention can easily carry out electrical characteristics test, even if a size of the electrode is made small. Further, the present invention can easily carry out the electrical characteristics test to the semiconductor device provided with the external terminal. Therefore, the present invention can provide the semiconductor device enabling miniaturization and high reliability.

(10) In the semiconductor device, the test pad may be larger than the electrode in size.

(11) In the semiconductor device, a resin layer formed with an opening which exposes the test pad may also be included.

(12) In the semiconductor device, a coating portion which covers the opening may also be included.

(13) In the semiconductor device, the electrode and the test pad are being electrically connected by a wiring, and the test pad may be wider than the wiring in width.

(14) In the semiconductor device, the land and the test pad are being electrically connected by the wiring, and the test pad may be wider than the wiring in width.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments to which the present invention is applied will now be described below with reference to the drawings. However, the invention is not limited to the embodiments described below. Further, the invention shall include any combination of the following contents.

FIGS. 1A through 4 are diagrams illustrating a method for manufacturing a semiconductor device according to the embodiment to which the present invention is applied.

Figure 1A:
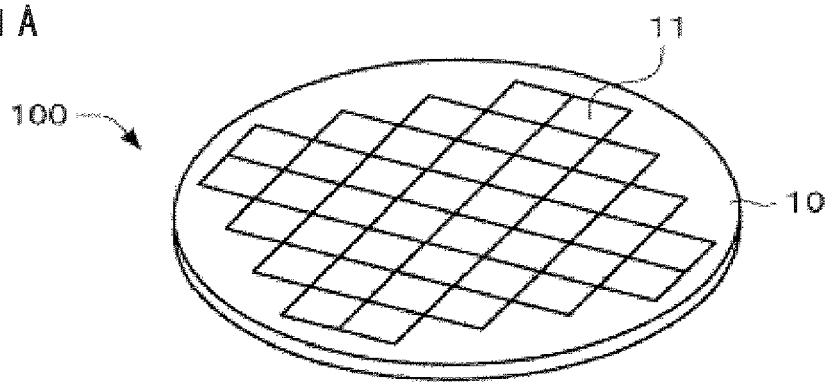
FIGS. 1A through 1C are diagrams illustrating a method for manufacturing a semiconductor device according to an embodiment to which the present invention is applied.
Figure 1B:
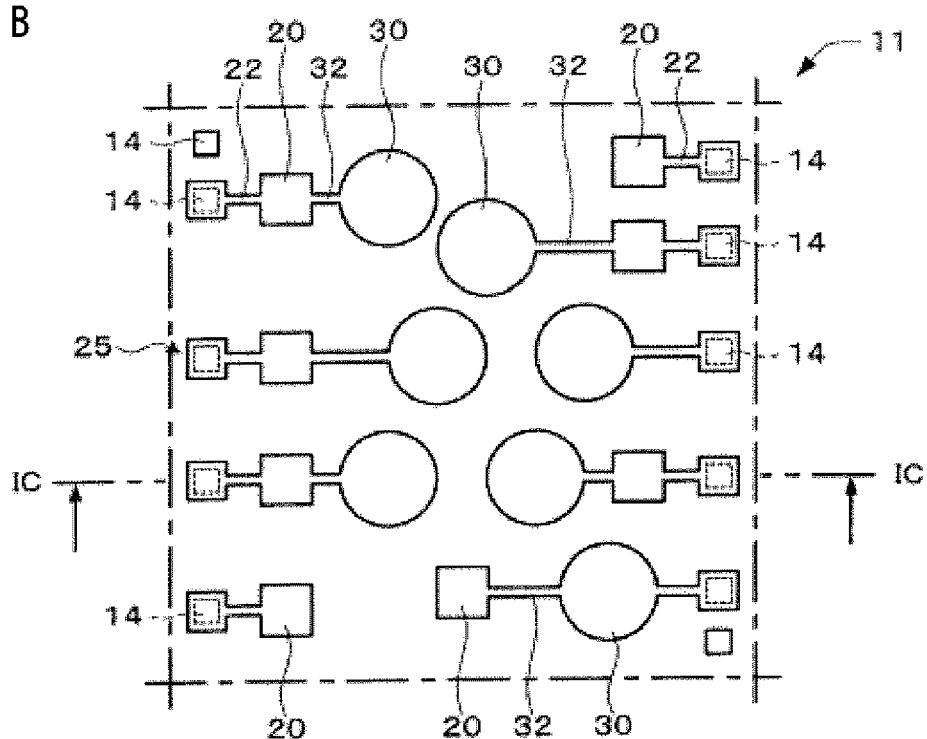
Figure 1C:
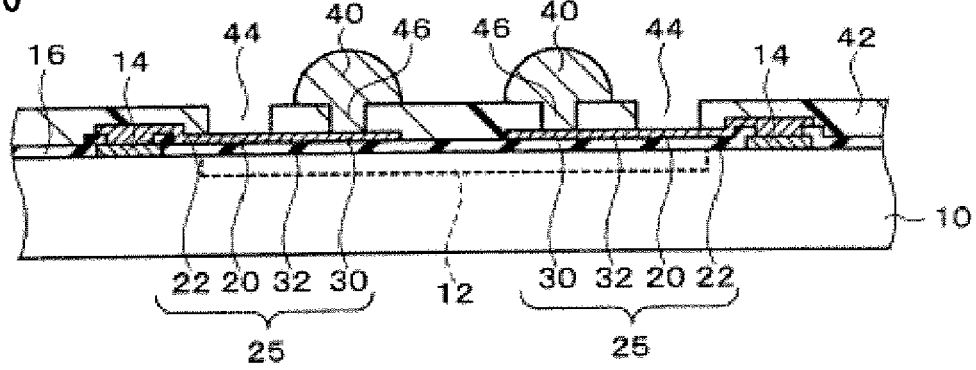

The method for manufacturing the semiconductor device according to the present embodiment includes a process of preparing a semiconductor module 100. In the beginning, with reference to FIGS. 1A through 1C, a structure of the semiconductor module 100 will be described. Further, FIG. 1A is a schematic diagram of the semiconductor module 100, and FIG. 1B is a top view showing a part of the semiconductor module 100. Furthermore, FIG. 1C is a magnified view taken along the line IC-IC of FIG. 1B. However, in FIG. 1B, an external terminal 40 and a resin layer 42 are omitted for illustrative purposes.

The semiconductor module 100 has a semiconductor substrate 10. The semiconductor substrate 10, for example, may be a silicon substrate. The semiconductor substrate 10 may be in a wafer state (see FIG. 1A). More specifically, the semiconductor substrate 10 may be a semiconductor wafer. The semiconductor substrate 10 in the wafer state may include a region 11 which is to become a plurality of semiconductor devices. However, the semiconductor substrate 10 may be in a chip state (not shown). More specifically, each of the following process may apply to a semiconductor chip, respectively.

The semiconductor substrate 10 has one or a plurality of integrated circuits 12 (there is one in the semiconductor chip and a plurality of them in the semiconductor wafer) (see FIG. 1C). The integrated circuit 12 may be formed in each region 11. A structure of the integrated circuit 12 is not particularly restricted, but for example, it may include an active element such as a transistor, and a passive element such as resistance, a coil, and a capacitor.

The semiconductor substrate 10, as shown in FIGS. 1B and 1C, has a plurality of electrodes 14. The electrode 14 may be formed on a surface which the integrated circuit 12 is formed. The electrode 14 may be electrically connected to the semiconductor substrate 10 internally. The electrode 14 may be electrically connected to the integrated circuit 12. Alternatively, it may be referred to as the electrode 14 including an electrode which is not electrically connected to the integrated circuit 12. The electrode 14 may be formed of a metal such as aluminum or copper. Further, a region shaped in a land, which is designed to be used for external electrical connection in internal wiring of the semiconductor substrate 10, may be referred to as the electrode 14. Alternatively, a region exposed from an opening of a passivation film 16, which will hereinafter be described, in the internal wiring of the semiconductor substrate 10, may be referred to as the electrode 14.

The electrode 14 may be electrically connected to a test pad 20 which will hereinafter be described. Every electrode 14 may be electrically connected to the test pad 20 at this point. Alternatively, the electrode 14 may include the electrode which is not electrically connected to the test pad 20. For example, the electrode 14 which is not electrically connected to the integrated circuit 12 may be the electrode which is not electrically connected to the test pad 20.

The semiconductor substrate 10 may have the passivation film 16. The passivation film 16 has the opening which exposes the electrode 14, respectively (for example, it may be a center portion of the electrode 14). The passivation film, for example, may be formed of $SiO_2$, SiN and a polyimide resin.

The semiconductor module 100, as shown in FIGS. 1B and 1C, has a plurality of test pads 20 which are electrically connected to the plurality of electrodes 14. A region, which the plurality of test pads 20 are being disposed, is not particularly restricted. For example, the test pad 20 may (only) be formed in a region overlapping with the integrated circuit 12. Alternatively, the test pad 20 may (only) be formed in a region inward from a forming region of the electrode 14. The plurality of test pads 20 may be arranged linearly, or may be in a staggered arrangement. Alternatively, the plurality of test pads 20 may be arranged at random. Further, the test pad 20 may be provided between a land 30, which will hereinafter be described, and the electrode 14. Furthermore, the test pad 20 may be disposed on the passivation film 16.

The test pad 20, as shown in FIG. 1B, may be larger than the electrode 14 in size. The test pad 20, as shown in FIGS. 1B and 1C, may be electrically connected to the electrode 14 by a wiring 22. And the test pad 20 may be wider than the wiring 22 in width.

Further, the test pad 20 may be electrically connected to the land 30 which will hereinafter be described. Every test pad 20 may be electrically connected to either one of the land 30. However, the test pad 20 may include a pad which is not electrically connected to the land 30.

The semiconductor module 100 has the land 30 which is electrically connected to either one of the test pad 20. The land 30 may be provided on the passivation film 16. Also, the land 30 may be formed between the test pad 20 and the electrode 14. The land 30 is being electrically connected to either one of the electrode 14. The land 30 may be electrically connected to the test pad 20 by a wiring 32. The land 30 and the test pad 20 may be wider than the wiring 32 in width at this point. Further, in the method for manufacturing the semiconductor device according to the present embodiment, every land 30 may be electrically connected to either one of the test pad 20, respectively. However, the semiconductor module 100 is being electrically connected to either one of the electrode 14, and may also include a land which is not electrically connected to the test pad 20.

In the semiconductor module 100, the wirings 22 and 32 may be extended from the test pad 20, and electrically connected to the electrode 14 and the land 30, respectively. However, the present invention is not limited to this. For example, two wirings may be extended from the land 30, and the respective wirings may be connected to the electrode 14 and the test pad 20. Alternatively, two wirings may be extended from the electrode 14, and the respective wirings may be connected to the test pad 20 and the land 30.

The semiconductor module 100, as shown in FIG. 1C, has an external terminal 40 which is provided on the land 30. The external terminal 40 is being electrically connected to the land 30. The external terminal 40, for example, may be formed of solder.

The semiconductor module 100, as shown in FIG. 1C, may have the resin layer 42. The resin layer 42 may be referred to as a resist layer. An opening 44 which exposes the test pad 20 is being formed in the resin layer 42. The resin layer 42 may be formed so as to cover the electrode 14 and the wirings 22 and 32. Also, an opening 46 which exposes the land 30 may be formed in the resin layer 42. The opening 46 may be provided so as to overlap with a center region of the land 30. And the external terminal 40 may be electrically connected to the land 30 by using the opening 46.

The semiconductor module 100 may have a stress relief layer which will not be shown. The stress relief layer may be the resin layer. The stress relief layer may be formed on the passivation film 16. And the test pad 20, the land 30 and the wirings 22 and 32, which were described earlier, may be formed on the stress relief layer.

The semiconductor module 100 may be configured as above. Further, the test pad 20, the land 30, and the wirings 22 and 32 may be combined to be referred as a conductive pattern 25. The method for forming the conductive pattern 25 is not particularly restricted. For example, the conductive pattern 25 may be formed by patterning a conductive layer formed on the semiconductor substrate 10. A shape of the conductive pattern 25 may be controlled by adjusting a shape of the resist layer which is to be used during a patterning process.

Figure 2:
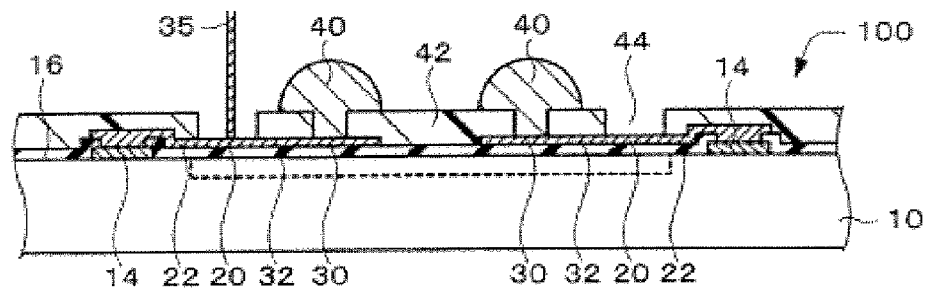
FIG. 2 is a diagram illustrating the method for manufacturing the semiconductor device according to the embodiment to which the present invention is applied.

The method for manufacturing the semiconductor device according the present embodiment, as shown in FIG. 2, includes testing electrical characteristics by bringing a probe 35 into contact with the test pad 20. The electrical characteristics of the integrated circuit 12 may be tested by the process. Alternatively, presence of disconnection in the conductive pattern 25 may be tested by the process.

Figure 3:
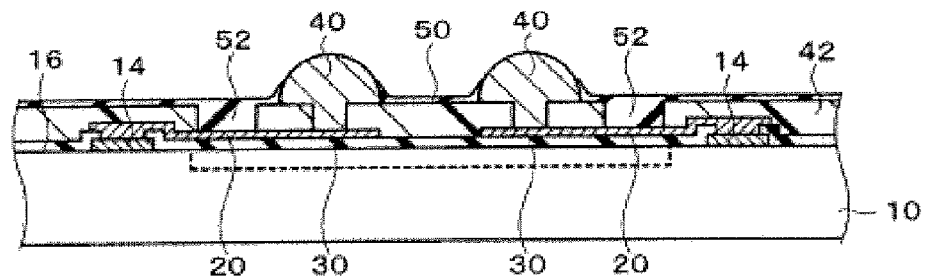
FIG. 3 is a diagram illustrating the method for manufacturing the semiconductor device according to the embodiment to which the present invention is applied.

The method for manufacturing the semiconductor device according to the present embodiment, as further shown in FIG. 3, may include forming a reinforcement layer 50 which is to reinforce a base of the external terminal 40. The process may be carried out after the above-described electrical characteristics test. The reinforcement layer 50 may be formed so as to fill in the opening 44 of the resin layer 42 during the process. More specifically, an exposed portion from the opening 44 in the resin layer 42 of the test pad 20 may be coated with the reinforcement layer 50. Further, in the reinforcement layer 50, a portion which covers the exposed portion from the opening 44 in the resin layer 42 of the test pad 20 may be referred to as a coating portion 52. More specifically, in the present embodiment, the coating portion 52 may be formed by the reinforcement layer 50. However, in the method for manufacturing the semiconductor device according to the present embodiment, only the coating portion 52 may be formed without forming the reinforcement layer 50.

Figure 4:
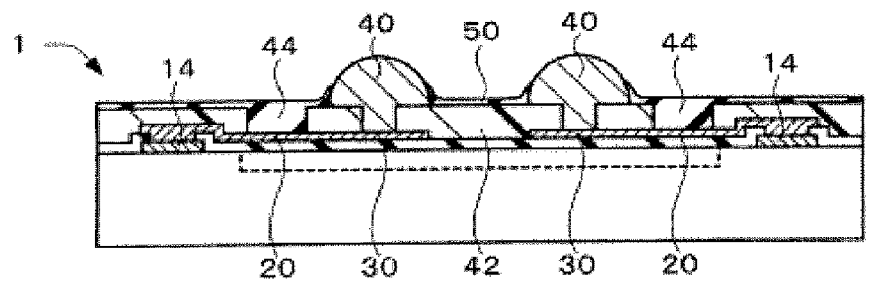
FIG. 4 is a diagram illustrating the method for manufacturing the semiconductor device according to the embodiment to which the present invention is applied.
Figure 5:
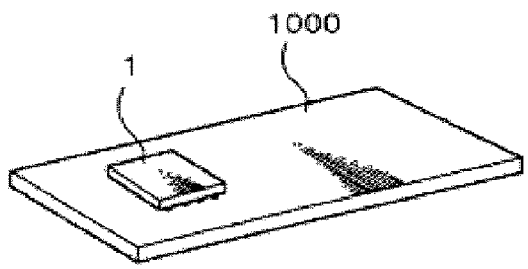
FIG. 5 is a diagram showing a circuit board mounted with the semiconductor device according to the embodiment to which the present invention is applied.
Figure 6:
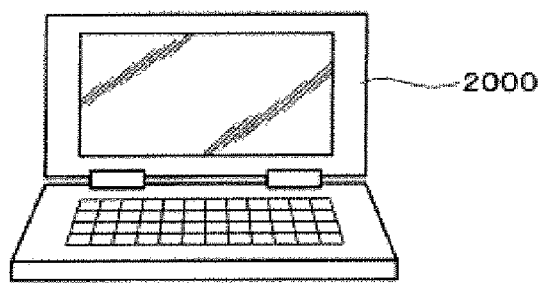
FIG. 6 is a diagram showing an electronic apparatus having the semiconductor device according to the embodiment to which the present invention is applied.
Figure 7:
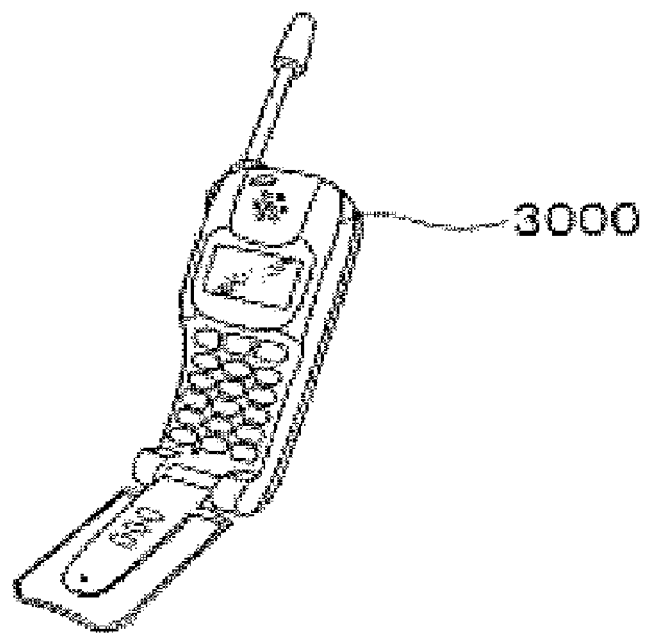
FIG. 7 is a diagram showing an electronic apparatus having the semiconductor device according to the embodiment to which the present invention is applied.

And by going through a process of dividing the semiconductor substrate 10 into individual pieces, a semiconductor device 1, as shown in FIG. 4, may be manufactured. FIG. 5 shows a circuit board 1000 mounted with the semiconductor device 1. And as an electronic apparatus which has the semiconductor device 1, FIG. 6 shows a notebook personal computer 2000 and FIG. 7 shows a cellular phone 3000, respectively. Further, a state before dividing the semiconductor substrate 10 into individual pieces, or the semiconductor module 100, may be referred to as the semiconductor device. The semiconductor module 100 can easily manufacture the semiconductor device which enables miniaturization and high reliability.

The method for manufacturing the semiconductor device according to the present embodiment can manufacture the semiconductor device which enables miniaturization and high reliability. The effect will hereinafter be described.

A probe test is generally known as a method for testing the electrical characteristics of the semiconductor device. This method is to test the electrical characteristics of a test object by bringing a test pin referred to as a probe into contact with the test object.

In order to test the electrical characteristics of the semiconductor device by the probe test, the probe was sometimes brought into contact with the electrode. But there is a limit to accuracy in controlling a position of the probe. Therefore, in order to carry out a reliable probe test using the electrode, the electrode needs to be formed larger than a certain size. But this restriction to the size of the electrode may cause difficulty in miniaturizing the semiconductor device (semiconductor chip). Further, with the recent progress in higher integration of integrated circuits, routing of the internal wiring of the semiconductor chip has become difficult. But if the electrode can be reduced in size, the routing of the internal wiring of the semiconductor chip will become easy, which enables to design the integrated circuit with high electrical reliability.

Furthermore, as a mean to test the electrical characteristics of the semiconductor device by the probe test, bringing the probe into contact with the external terminal (land) may be considered. But this method cannot test the electrode which is not connected to the external terminal (land). Also, when the probe is pressed against the external terminal, the applied pressure to the external terminal may cause damage or a fall of the external terminal.

Correspondingly, in the method for manufacturing the semiconductor device according to the present embodiment, the electrical characteristics test is carried out by bringing the probe into contact with the test pad 20. Therefore, as there is no need to use the electrode 14 for the electrical characteristics test, the electrical characteristics test can be carried out even if the electrode 14 is miniaturized. And if the electrode 14 can be miniaturized, the semiconductor device (semiconductor chip) can also be miniaturized. More specifically, the present invention can provide the method for manufacturing the semiconductor device which enables miniaturization as well as maintaining electrical reliability, as it can carry out the electrical characteristics test even if the electrode 14 is miniaturized. In other words, when the semiconductor module 100 is used, the semiconductor device which is small in size and high in reliability can be provided. Especially, by making the test pad 20 larger than the electrode 14, the electrical characteristics test can be carried out easily. Further, according to the present invention, the electrical characteristics test can be carried out to the semiconductor module 100 provided with the external terminal 40, without using the external terminal 40. Therefore, the electrical characteristics test can be carried out without damaging the external terminal 40, and the electrical characteristics test towards the electrode 14 which is not electrically connected to the external terminal 40 (land 30) can be carried out. Furthermore, in the event that the semiconductor module 100 has the resin layer 42 formed with the opening 44 which exposes the test pad 20, the opening 44 (an inner wall of the opening 44) becomes a guide, and prevents the probe disconnecting from the test pad 20 (see FIG. 2). Therefore, the highly reliable electrical characteristics test can be carried out with ease. Also, by forming the coating portion 52, a deterioration of the test pad 20 can be prevented. Further, the coating portion 52 may be formed of a softer material than the resin layer 42. By doing so, even after the coating portion 52 is formed, the probe test can be carried out with ease. More specifically, as the probe test can be carried out in a state closer to a product, the more reliable semiconductor device can be manufactured. The coating portion 52 may be formed of a transparent material, at this point. Furthermore, the reinforcement layer 50 at a base may be formed so as to have a concave portion overlapping with the test pad 20. In such a structure, the position of the test pad 20 can easily be determined, even after the process of forming the reinforcement layer 50 at a base or the coating portion 52, which enables to carry out the electrical characteristics test more effectively and reliably.

Further, the present invention is not limited to the above-described embodiments, and various modifications may be possible. For example, the present invention includes configurations that are substantially the same as the configurations described in the embodiments (for example, configurations having the same function, method and result, or configurations having the same objective and purpose). Furthermore, the present invention includes configurations in which an unessential part of the configuration described in the embodiment is replaced. In addition, the present invention includes configurations having the same effect or achieving the same objective as the configurations described in the embodiments. Also, the present invention includes configurations in which conventional technology is added to the configurations described in the embodiments.

What is claimed is:

1. A method for manufacturing a semiconductor device, comprising:
    preparing a semiconductor module including:
        a semiconductor substrate having an electrode;
        a test pad electrically connected to the electrode;
        a resin layer formed with an opening exposing the test pad;
        a land electrically connected to the test pad; and
        an external terminal provided on the land;
    testing an electrical characteristic by bringing a probe into contact with the test pad; and
    forming a coating portion covering an exposed portion from the opening in the resin layer of the test pad, after the electrical characteristic test.

2. The method for manufacturing the semiconductor device according to claim 1, wherein the test pad is larger than the electrode in size.

3. The method for manufacturing the semiconductor device according to claim 1, further comprising:
    forming a reinforcement layer reinforcing a base of the external terminal.

4. The method for manufacturing the semiconductor device according to claim 1, wherein the coating portion is formed by the reinforcement layer.

5. The method for manufacturing the semiconductor device according to claim 1, wherein
    the electrode and the test pad are electrically connected by a wiring and
    the test pad is wider than the wiring in width.

6. The method for manufacturing the semiconductor device according to claim 1, wherein
    the land and the test pad are electrically connected by a wiring and
    the test pad is wider than the wiring in width.

* * * * *